United States Patent [19]

Castellani et al.

[11] 4,080,267

[45] Mar. 21, 1978

[54] METHOD FOR FORMING THICK SELF-SUPPORTING MASKS

[75] Inventors: Eugene E. Castellani, Putnam Valley; Patrick M. McCaffrey, Mahopac Falls; Aloysius T. Pfeiffer, Peekskill; Lubomyr T. Romankiw, Briarcliff Manor, all of N.Y.

[73] Assignee: International Business Machines Corporation, Armonk, N.Y.

[21] Appl. No.: 645,108

[22] Filed: Dec. 29, 1975

[51] Int. Cl.² .................... C25D 5/02; C25D 1/08; C25D 1/20
[52] U.S. Cl. ......................... 204/15; 204/11; 204/24
[58] Field of Search .................. 204/11, 24, 42, 15

[56] References Cited

U.S. PATENT DOCUMENTS

| | | | |
|---|---|---|---|
| 2,598,318 | 5/1952 | Teal | 204/24 |
| 3,192,136 | 6/1965 | Reid | 204/11 |
| 3,342,706 | 9/1967 | Liben et al. | 204/11 |
| 3,402,110 | 9/1968 | Scherrer | 204/11 |
| 3,637,380 | 1/1972 | Hallman | 204/15 |
| 3,878,061 | 4/1975 | Feldstein | 204/11 |

*Primary Examiner*—T. M. Tufariello
*Attorney, Agent, or Firm*—Pollock, Vande Sande & Priddy

[57] ABSTRACT

A method of constructing a relatively thick, self-supporting mask suitable for electron beam projection processes. Thickness is achieved by multiple steps of coating with resist, exposure, development and plating. First an intermediate or lift off layer is deposited on a substrate. A plating or a cathode layer may then be deposited. Resist is then applied. A first mask layer comprises metal plated in accordance with the first pattern. For the second exposure a geometrically similar pattern is employed to generate larger apertures. Thus, if the first mask layer has 0.20 mil apertures, the second layer might have corresponding 0.21 mil to 0.22 mil apertures. For initial mask patterns of about 2 mil the second layer might be 2.02 mils. If desired, a third exposure can be employed with a third pattern, similar to the first two, but having larger apertures (by 0.02 to 0.03 mils) than the second pattern.

29 Claims, 22 Drawing Figures

METHOD FOR FORMING THICK SELF-SUPPORTING MASKS

FIELD OF INVENTION

The present invention is directed at methods for forming self-supporting masks adapted to be employed in electron beam projection lithography and X-ray lithography.

BACKGROUND OF THE INVENTION

In the past years the lithographic technology applied to transferring patterns from masks to devices under construction has become highly developed and widely used. Masks, such as those employed in these processes, are used with a variety of radiation sources such as light, both visible and ultraviolet, as well as X-rays and electron beams. An example of an electron beam system is given in Broers et al, U.S. Pat. No. 3,876,883. Other systems employing light as a radiation source are found in U.S. Pat. Nos. 3,152,938; 3,458,370; 3,712,816; 3,758,326 and 3,832,176.

Masks for use with electron beam projection processing apparatus, such as that disclosed in the aforementioned Broers et al patent have a number of requirements in common with other masks, and some requirements which are unique to electron beam masks. In the first place, one desires the ability to provide a small aperture which is well defined. The desire for this characteristic should be apparent to those skilled in the art in that the minimum size opening in the mask limits the size of the features that can be transferred from the mask to any receiver (although not necessarily on a one-to-one basis since some exposure systems may actually reduce the mask features during exposure.) The ability to transfer a particular pattern is based upon the mask definition of that pattern. In addition to the foregoing requirements, however, a requirement unique to electron beam projection masks is the requirement that the mask be self-supporting, even if the mask is heated during its operation by absorption of electrons. For example, in some applications the mask must remain plane to within 1 mm across a 3 inch span without any external support and in the presence of heat. Since the electron beam is substantially incapable of passing through even the thinnest of substrates, the mask must be characterized by the absence of material at locations where it is desired that the electron beam pass through the mask. Since the mask must have sufficient strength and rigidity to remain in an integral condition without outside support, the mask itself must be thick enough to provide this function. To provide self-support and yet be capable of very high resolution patterns, the mask thickness often must exceed the lateral dimension of the smallest aperture in the mask. That is, the ratio of thickness to lateral dimension (or aspect ratio) must be greater than 1. In addition, since most, if not all, electron beam projection systems employ magnetic focusing coils to project a pattern smaller by a factor as much as ten times smaller than the original pattern one desires the mask to be comprised of non-magnetic material so as to not interfere with the focusing operation. Since electrons impinging onto the mask dissipate heat a further requirement is that the mask be constructed of metal capable of high heat conductivity to permit fast enough removal of heat and prevent overheating of the mask. Masks produced by this technique can also be used as X-ray masks in X-ray lithography.

In addition, since such masks are preferably made by additive plating techniques, they should be preferably constructed from readily platable metals such as gold, copper, silver, platinum, chrome, zinc or any other such non-magnetic readily platable metal or alloy thereof.

Although the prior art evidences methods of forming masks and screens a problem exists in providing a method of forming a mask which is thick enough to be self-supporting, particularly when heated as by impact of electrons and when as large as about 3 inches in diameter which is capable of providing a very small aperture, which is well defined and with aspect ratio greater than 1. The prior art processes are sufficient to provide small apertures reasonably well defined by employing a computer controlled mask or the like and exposing an electron beam, photoresist or other radiation sensitive material to radiation which is modulated by a desired pattern. A single such exposure will not, however, in accordance with the prior art teachings, provide a sufficiently thick mask to be self-supporting. If one attempts to increase the thickness by merely extending the parameters of the prior art processes using a single deposited layer definition is degraded. In particular the radius of curvature of corners increases with increase in resist thickness. When the radius increases above certain limits definition is degraded. On the other hand, it is possible to employ a plurality of exposures of a photoresist or other suitable radiation sensitive material with the well known steps of developing and/or developing and plating between exposures. One difficulty with this approach is that the masks employed for the several exposures must be aligned with the partially formed mask in each of the different exposures. Due to the extremely small dimensions of the various pattern components on the mask this has proved to be a time consuming operation.

One particular way of using such electron beam masks imposes further restrictions on mask tolerances. Specifically, in some applications the mask aperture negative tolerance is zero. That is, the mask aperture must be no smaller than the nominal size. Clearly if one employs a method of forming such mask with multiple steps of coating, exposure, development and plating with identical forming masks, there is absolutely no tolerance, for even the smallest misalignment will reduce the resulting aperture below nominal size. This aspect imposes almost insurmountable problems to the multiple step operation employing identical masks.

It is therefore an object of the present invention to provide a method of fabricating a mask suitable for electron beam processes which eliminates the necessity for this precise alignment in several different exposures. It is another object of the present invention to provide a method for fabricating a mask suitable for electron beam process which is self-supporting and yet which eliminates the necessity for practically unattainable mask alignment during fabrication of the mask itself.

Furthermore, it is a purpose of this invention to provide masks made of readily platable non-magnetic materials with good heat conductivity to permit quick removal of heat which accumulates due to electrons striking the mask and dissipating heat.

SUMMARY OF THE INVENTION

These and other objects of the invention are achieved by employing conventional processes to fabricate a relatively thin mask (i.e., with aspect ratio less than 1) deposited on a substrate with an intermediate layer lying between the mask and substrate. The material of the intermediate layer is selected so that it can be easily selectively removed in order to lift the mask off the substrate at the conclusion of the process without chemically attacking the mask or substantially changing its dimensions. The several steps of the inventive process are particularly directed at increasing the thickness of the mask without requiring unattainable precise alignment during the exposure step or steps.

To increase the reader's understanding of this description it is desirable to distinguish between the mask constructed in accordance with our invention and masks which are used in the inventive method for transferring a pattern to the mask being built. To provide for this distinction we employ the coined term "forming mask" to represent conventional masks used in the inventive process to produce our novel mask. Returning to the description of our invention we have found that if we employ multiple masking, we can meet the required mask characteristics by employing forming masks having similar patterns but resulting in slightly larger apertures than the preceding steps. For instance, if we employ a first forming mask to define a pattern whose smallest aperture is 0.2 mils, we can employ a second forming mask, for a second masking step with a similar pattern giving a larger aperture by about 10 percent for the 0.2 mil original aperture or larger by 0.02 mils for any larger aperture. That is, the smallest apertures in the second forming mask would result in a 0.22 mil aperture. A third forming mask, if employed, would have a pattern geometrically similar to that of the first and second forming masks but result in still larger apertures, about 0.24 mils. For some types of pattern transfer, i.e., E-beam exposure, a forming mask per se is not necessary. In this case we employ a forming mask for subsequent exposures, with a pattern similar to the previously transferred pattern, i.e., that transferred by the E-beam exposure.

The definition of a plated layer is obviously a result of a number of factors such as the accuracy with which the resist is exposed, the care with which it is developed and the precision with which the resulting "holes" are plated. We have found that straight galvanostatic constant current DC plating tends to build up the edges of an aperture faster than other portions of the area which are plated providing the bath does not contain suitable additives which suppress deposition in high current density areas. Such action is extremely detrimental to the accuracy of the aperture in the final product. Therefore, we prefer to employ pulse potentiostatic plating, or a particular plating solution which inhibits this uneven material buildup and in particular the more rapid build up of the plated material near the edges of the apertures.

More particularly, a suitable conformable substantially flexible and/or thin substrate is selected which is coated with a readily selectively soluble metal or polymer (which will be selectively removed after the mask fabrication is completed) to form an intermediate layer. This layer is then metalized with a thin cathodic platable metal layer. A layer of resist, up to about 2.5 microns and preferably no greater than 1.6 microns is coated on the conformable substrate and exposed with a desired pattern. After developing a thin (no thicker than the resist layer and with aspect ratio less than 1) metal mask or mask layer is then electro formed by electro plating. The resist may be removed or it can remain, as explained later. Cathode layer can be removed, although it is not necessary to remove it. The intermediate layer preferably should not be removed. If the first layer has features smaller than 0.1 um which are formed using electron beam lithography or X-ray lithography, the second may be formed using U.V. lithography and the larger patterns may go around 2, 4 or a group of small dimension patterns.

A second resist coating is applied, which can be relatively thicker than the first coating (e.g., 3-5 microns). A second exposure is not effected with a similar but slightly oversized pattern. For instance, if the first mask layer contains 0.2 mil apertures, this second mask layer can employ corresponding apertures of 0.22 mils. Preferably the second mask layer is geometrically similar to the first, although, as pointed out above, the features are slightly larger. The second exposure may be underexposed. The second layer of photo resist is then developed and additional material is electro plated into the holes left in this second layer of resist. The second layer can be plated up to the thickness of the surrounding resist or slightly overplated. This plated layer provides the necessary support to the first layer and in some cases can provide sufficient support to eliminate the necessity for any further plating steps.

If necessary, however, additional steps of coating with resist, exposure, development and plating can be employed, with each subsequent series of steps employing forming masks with similar but larger patterns. As an alternative to employing a similar pattern for the third or last masking step, however, a pattern of reinforcing ribs can be employed which is not similar to the first or second mask. Instead it forms frames or windows around groups of patterns. A requirement for this third pattern, however, is that it not interfere with the holes in the first or second plated layers. If desired, the plating in the third or subsequent steps can be overplated, that is, plating can be allowed to extend above the layer of the resist coating as long as it does not obscure the pattern in the first layer which defines the apertures as viewed from the top and thus does not obscure the path of electrons.

The foregoing steps conclude the portion of the process which defines the pattern. We shall refer to the portion of the mask containing the pattern as the active area. At this point a very thick (at least 5-25 microns) layer of resist is applied over the entire mask and a wide frame mask is exposed around active area. The frame mask contains in it a plurality of small apertures about 0.25 to 1.0 in size spaced at regular intervals. After removal of the plating base (the cathode layer) the aperture allows the intermediate layer etching solution to penetrate easier and speed up the lift-off of the mask from the substrate. The exposed resist is developed and additional plating occurs to provide strength. After the plating the remaining resist is removed.

At this point, the deposited frame metal defines a frame around the active area of the mask and the pattern in the masking area includes a series of apertures through each of the metal layers down to the plating base. The plating base is now sputter etched to remove the same. Concluding the process the mask is lifted off the substrate by selectively removing the intermediate layer, whether metal or polymer. An etching solution is desirably employed which will not attack the frame or mask. The lift-off process can be speeded up by agitation and/or heating.

To provide good pattern definition, i.e., apertures on the order of 0.2 mils or smaller, the resist exposure, development and plating must employ carefully controlled techniques. Thus, straight galvanostatic DC plating out of bath without suitable additives is unacceptable because it tends to build up the edges and degrades pattern definition. Pulsed potentiostatic or pulsed galvanostatic plating can be employed in connection with baths without additives or improperly formulated plating baths to remedy this situation. Alternately, a proper bath additive combination provides a solution to this problem.

The resists employed are chosen in connection with the contemplated type of exposure. Thus, one may use U.V. sensitive resists and U.V. exposure for one or more of the exposing steps. Alternatively, X-ray sensitive resists and X-ray exposure can be employed. In fact, one can use X-ray exposure and a suitable resist for some exposure steps and U.V. exposure, along with a suitable resist for other exposures in forming a mask. Alternatively, one may use E-beam exposure, along with a suitable resist, for one or more exposures and other radiation for other exposures. E-beam exposure is well suited for forming extremely fine patterns (i.e., below 0.1 mil in dimensions) or when extreme precision and accuracy are required. For example, E-beam exposure can be used for the first layer with U.V. exposure for the other layer or layers.

When using E-beam exposure, a forming mask preferably would not be employed and, instead, computer control is used to generate the pattern.

The resists used may be either positive or negative resists, with suitable modifications made to the polarity of the forming mask, or the computer control, in the case of E-beam exposure.

BRIEF DESCRIPTION OF THE DRAWINGS

In describing our invention we will make reference to the attached drawings in which like reference characters identify identical apparatus and in which:

FIG. 2b is a cross-section of FIG. 2a;

DETAILED DESCRIPTION OF THE PREFERRED EMBODIMENTS

Figure 1A:
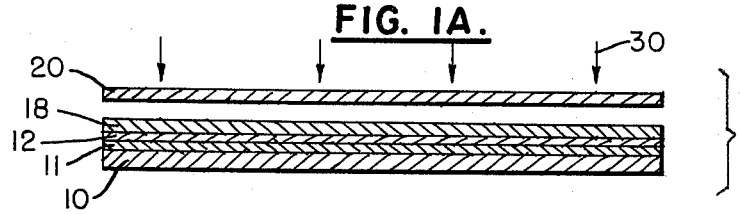
FIGS. 1a through 1h are cross-sections of a portion of a mask illustrating its configuration during various steps of the process.

A preferred embodiment of our inventive process will now be described. In this portion of the description we refer only to formation of a single typical aperture. Later we refer to requirements dictated by aperture spacing. In order to provide support for the mask as it is being built up we employ a substrate of silicon, glass, sapphire or quartz. Preferably, if glass-quartz, silicon or sapphire is employed it is relatively flexible so that the rather large active area (approximately 3 inches) will, after being suitably processed, conform to a forming mask employed in masking steps. That is, glass is very smooth over short distances. Over longer distances, while the glass may exhibit some "waviness" the flexibility of the glass allows it to conform to a forming mask thereby permitting very good pattern definition and very accurate reproduction of the patterns on the forming mask over the relatively large active area. On the other hand, semiconductor quality polished silicon wafer (whose surface is oxidized to silicon dioxide) although not as flexible as glass will nevertheless be conformable because it is much smoother than glass. In any event, a conformable substrate is provided. As shown in FIG. 1a, on this substrate 10 a material 11 is deposited which can be selectively and readily dissolved in the presence of a metal from which the mask will be constructed so as to permit lift-off of the mask from the substrate. For example, this intermediate layer of material 11 can comprise A Shipley resist or other easily soluble polymer or a metal of low nobility (high electro chemical or chemical reactivity) such as Ti, Al, Cr, Zn, Hf, Nb, Ta, etc. The thickness of this layer may be anywhere from about 1000 A to 10,000 A.

Atop this intermediate layer a plating base 12 (300 to 3,000 A) of a readily platable more noble metal is deposited, such as gold, copper, silver, platinum, etc. As an alternative to using an intermediate layer of one material and a different plating base, the same layer can be used for both purposes, if the material is carefully selected. For example, Ni, Co, Fe, Zn, Cu, Cd, Sn or alloys of these materials can act as both intermediate layer and plating base.

Atop this plating base a thin layer of Shpley resist 18 is provided. When using conventional UV lithography as practiced today, preferably this resist is no thicker than 2.5 microns and about 1.6 microns appears to be an optimal thickness. After coating, the desired pattern is exposed. As shown radiation 30 exposes the resist 18 in a pattern determined by the forming mask 20. For example, the forming mask 20 may comprise an array of 0.2 mil (or smaller) squares. The thickness of layer 18 is kept relatively small to permit good pattern resolution during exposure. Since this step defines the edges of the final pattern proper exposure and development are critical. The conformable nature of the substrate chosen allows it to conform to the forming mask 20 for good pattern transfer. Although an optical forming mask and light (visible or invisible) may be used, for some applications it may be desirable to employ an electron beam exposure. In this case, the forming mask 20 is eliminated and the pattern is generated using a computer program and an x-y table or any other means conventionally used in connection with E-beam lithography.

Figure 1B:
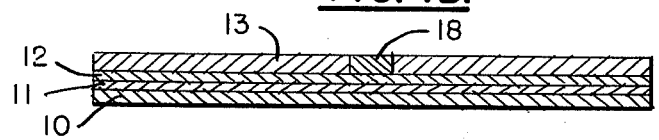

Subsequent to exposure and development metal 13 is plated into the area left as a result of development as shown in FIG. 1b. The metal plated should be non-magnetic, a good conductor of heat, and plated to a height no higher than that of the resist and preferably in the range of between 1 and 2 microns. Suitable materials for this metal are gold or copper.

As mentioned above, we have found that conventional galvanostatic DC plating tends to unevenly build up metal at the edges of an aperture, degrading definition. To avoid this, we employ a bath having additives to inhibit this uneven metal growth. Particularly, the additive adsorbs preferentially in the high current density areas improving current density distribution and consequently leveling. One such bath is Selrex BTD-510, which is a sulfite gold bath. We have also found that pulsed potentiostatic plating and pulsed galvostatic plating with proper pulse width does not exhibit this undesirable uneven metal growth, despite the fact the bath may not contain the proper additives. For example, plating pulses of millisecond width at a rate of 100 to 1,000 hz is suitable. It is possible to employ either the above-mentioned additives with galvostatic DC plating, or the pulsed plating with no additives.

Figure 1C:
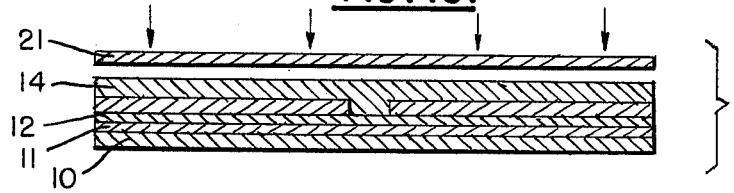

Subsequent to plating the metal layer 13, the remaining resist 18 may be removed and fresh resist 14 is applied, as shown in FIG. 1c. On the other hand, it may be desirable to leave the remaining resist 18 and merely apply additional resist 14 over the metal 13 and resist 18. Since the second layer of resist will be used to form the second metal layer, whose definition is not critical, but is mainly employed for support purposes, the thicknes of this resist coating 14 can be increased. Preferably, the second layer of resist coating 14 is between 3 and 5 microns. The partially formed mask 21 is now aligned with a second forming mask 21 and a second exposure effected. It is important to our invention that the pattern on the forming mask 21 not be identical to the pattern on the originally used forming mask 20. More specifically, the active area pattern on the forming mask 21 will be geometrically similar to the pattern on the forming mask 20, but slightly oversize so as to define a pattern, on the partially formed mask, which is slightly oversized. Preferably, the difference in size is about 10% so that assuming the 0.2 mil apertures formed by the first forming mask 20, the apertures formed by the second forming mask 21 will be on the order of 0.22 mils. The alignment of the second forming mask 21 and the exposure of the photoresist 14 to radiation modulated by this mask 21 is illustrated in FIG. 1c.

Of course, when the first exposure was by E-beam, there is no first forming mask. In this case, however, the forming mask used to expose the second layer has a pattern which is geometrically similar to the pattern of the first layer, although somewhat oversized, as explained above.

Figure 1D:
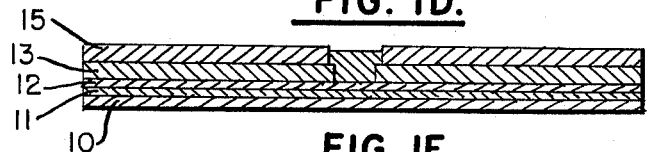
Figure 1E:
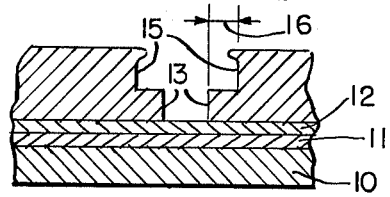

The resulting product is then developed and plated, using techniques similar to those mentioned above. Preferably, the metal plated in this second plating layer will be the same as that plated in the first layer although a different metal or alloy which is stiffer may be employed, as long as this metal layer or combination of metals will not be chemically attacked by the etchant used during the final step of lifting the mask. FIG. 1d illustrates the resulting product showing the first metal layer 13 and the second metal layer 15. FIG. 1e is an enlargement showing the portion of FIG. 1d inside the dashed line (with resist omitted) illustrating the aperture resulting from the previously described steps. As a result of the difference in the patterns of forming masks 20 and 21, (or the difference between forming mask 21 and the first layer pattern), the aperture in the metal layer 15 is wider than the aperture in the first layer 13 by twice the amount identified by the reference character 16. More specifically, using the example we have mentioned of a 0.2 mil aperture in the metal layer 13, and a 0.22 mil aperture in the metal layer 15, the setback identified by reference character 6 will be 0.01 mils.

Figure 1F:
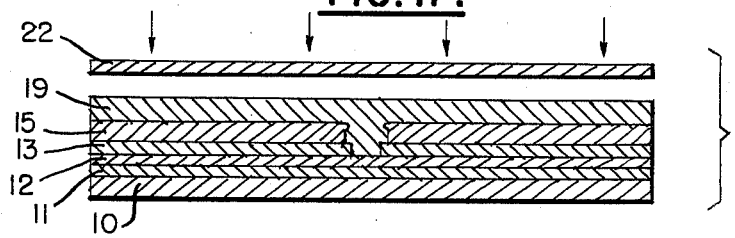

Mask thickness may, at this point, be sufficient so that no additional layers need be provided in the active area. Of course, it may be desirable to add a frame around the mask for further support. In addition to the foregoing, however, there is a further alternative available, namely adding an additional layer of mask thickness in the active area, i.e., in the area of the mask which is to transfer a pattern. The additional layer of mask thickness may (although not necessarily) employ a pattern similar to the pattern previously employed in the previous two exposures. A forming mask 22 suitable for such purpose, is illustrated in FIG. 1f. In line with the preceding discussion the resulting pattern transferred to the additional resist coating 19 would be such as to generate apertures which are larger (by about 10%) than the apertures provided in the second layer, i.e., layer 15. On the other hand, however, the pattern employed with forming mask 22 need not be similar to the previous patterns employed, but may comprise a pattern suitable for plating a series of reinforcing ribs, windows or areas in selected portions of the active area of the mask being manufactured. The reinforcing ribs, etc., will, of course, not obstruct any of the already formed apertures. Since the purpose of the reinforcing ribs or reinforcing areas forming this third layer is to provide structural strength, and provide easy paths for heat removal it is generally desired to have this layer be as thick as possible consistent with the other requirements. Some apertures, formed through the first and second layers, may be so close together as to render it impossible to plate any further material therebetween. Of course, other portions of the active area of the mask may have apertures so widely separated that one, a number of "ribs", or a large area, can be plated therebetween. Fortunately, the areas in the mask which have relatively closely spaced "apertures" need less reinforcement and heat up less because fewer electrons strike this area than the areas of the mask in which the apertures are not so closely spaced. This is a function of the fact that, in use, apertures allow electrons to pass. Those electrons which pass through the mask do not generate heat. On the other hand, where apertures are relatively widely spaced a majority of the electrons impinge on the mask causing localized heating. It is these areas which require further reinforcing to prevent sagging. With the foregoing principles in mind those skilled in the art can readily arrange a pattern of reinforcing ribs where necessary.

Thus, the next step after the mask reaches the condition illustrated in FIG. 1d, is a coating of an additional layer of resist 19, if it is determined that additional mask thickness is desired. This resist 19 may be 4–6 microns in thickness, and provide a structure such as that shown in cross-section in FIG. 1f. A further forming mask 22 is now aligned with the partially formed mask and the resist is exposed with radiation modulated by the mask 22. As noted above, the pattern carried on forming mask 22 may be geometrically similar to the pattern previously employed in masks 20 and 21, or, on the other hand, may contain a pattern suitable for plating reinforcing ribs where desired.

Figure 1G:
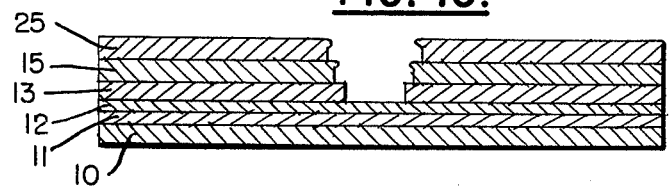
Figure 1H:
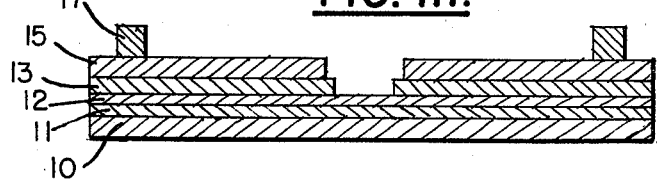

After exposure, the resist 19 is developed and plating carried out. For this third layer, the resist may actually be underexposed and/or the plating may be overplated. The resulting product is shown in cross-section in FIG. 1g for the case where the third pattern is similar to the second. As is illustrated, the aperture in layer 15 is slightly larger than the corresponding aperture in the first layer 13, and, the aperture in the third layer 25 is slightly larger than the corresponding aperture in the second layer 15. On the other hand, FIG. 1h illustrates the result where the third layer has ribs 17 or other areas in the third layer. Significantly, the third plated layer does not overlie the aperture.

The preceding discussion has treated the manner in which a single aperture is generated in each of a plurality of layers. Since the discussion was limited to a single aperture, we now point out some practical requirements dictated by patterns and portions of patterns which may be encountered in practice.

Figure 2A:
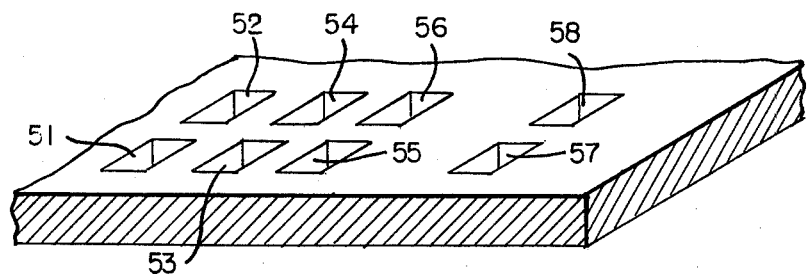
FIGS. 2a and 2c are partial isometric views of portions of a mask at various stages of manufacture.
Figure 2B:
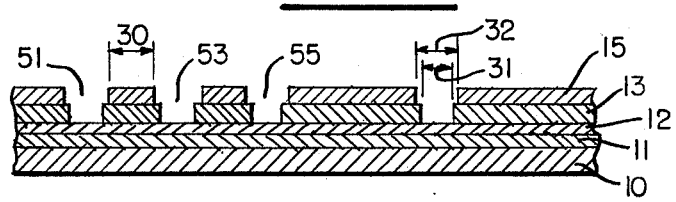
Figure 2C:
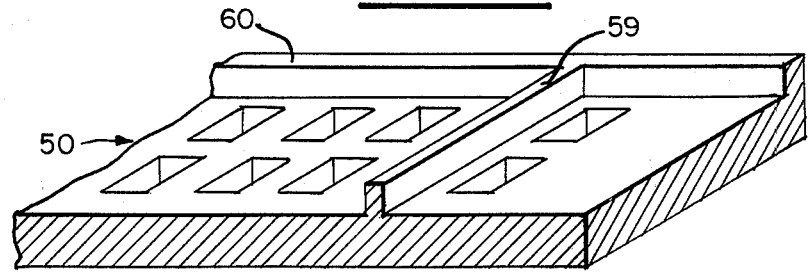

To that end, FIG. 2a illustrates a three dimensional view of a portion of a partially completed mask 50 constructed in accordance with the teachings of this invention. More particularly, the mask 50, which may be built up with a number of different layers, not illustrated, includes a pattern of apertures 51-58. FIG. 2b is a cross-section of FIG. 2a taken on a line through apertures 51-57. FIG. 2b, illustrates, in detail, the various layers making up the partially completed mask 50, as well as the relationship of those layers to form the plurality of apertures. As is illustrated in FIG. 2b, the first mask layer 13 includes an aperture whose dimension is illustrated by reference character 32. Of course, it is not necessary for all the apertures in a single layer to be equal in size, although they often are. Typically, corresponding apertures in the second layer 15 are larger (by approximately 10% or 0.02 mil, whichever is smaller) and have a dimension illustrated by reference character 31. The center-center spacing of some apertures, such as 51 and 53 may allow a distance between the apertures, at the surface of the second layer 15, such as represented by reference character 30. This distance may, in fact, be too small to admit of providing a third layer. That is, it may not be feasible to lay down additional material with a dimension smaller than that of reference character 30. On the other hand, it may not be necessary to provide an additional layer at this location in the mask. Of course, where feasible and necessary, the third layer may take the form illustrated in FIG. 1g or 1h. On the other hand, it may be necessary to provide additional reinforcement at certain locations in the mask. Such reinforcement may be provided by a series of reinforcing "ribs" or areas. A portion of such ribs are illustrated in FIG. 2c, wherein they comprise ribs 59 and 60. A pattern of reinforcing ribs, such as ribs 59 and 60 may be laid down on the mask in the following fashion.

Figure 2D:
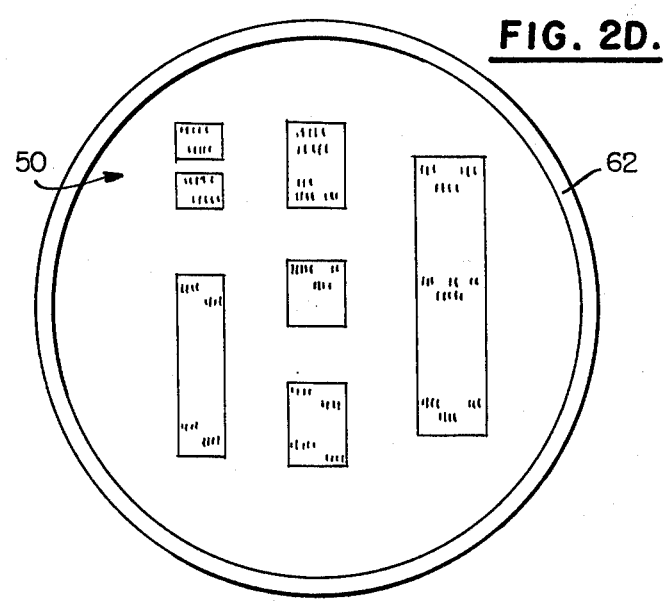
FIG. 2d is a plan view of a typical completed mask.

Atop the mask illustrated in FIG. 2b, an additional layer of resist is deposited. The thickness of this resist may be 4-8 microns, or larger. Since the thickness of the resist determines the precision with which metal may be plated, the thickness of the resist may be chosen in accordance with the precision with which the ribs must be located. It is essential that no portions of the plating which is to form the ribs overlies any portion of an already opened aperture. A suitable forming mask is employed, and the resist which had been laid down is exposed to suitable radiation through the mask, and the resist is developed leaving "channels" or "areas" in the locations where the ribs are to exist. Metal is plated into these "channels" or "areas" and the remaining resist is removed, leaving a number of ribs or plated areas upstanding in those locations defined by the pattern in the resist. FIG. 2d illustrates the mask 50 in plan view wherein the apertures are schematically illustrated by short vertical lines. A plurality of spaced reinforcing ribs 61 have been deposited atop the upper layer of the mask for reinforcing purposes except in the area occupied by apertures. Of course, those skilled in the art will understand that the pattern of apertures illustrated in FIG. 2d is provided for illustrative purposes only and is not meant to depict any particular pattern.

Once the desired number of mask layers has been deposited with the desired pattern an additional layer of resist is coated on the mask which is relatively thicker than anything previously used. This layer of resist will be employed to plate a frame around the mask for reinforcing purposes. Typically, this resist may be 4 to 10 or up to 25 microns in thickness, or thicker. The areas which are to be occupied by the frame are sufficiently spaced from the various apertures so that the metal plated to form the frame will not obscure any of the apertures. After the resist has been coated on the mask it is exposed to radiation modulated by a frame forming mask and when developed provides a series of channels around the outer edge of the mask for plating of the frame members. Electroplating is then effected to electroplate the various members 62 of the frame and then the remaining resist can be removed. The result is shown, in plan view in FIG. 2d. Those of ordinary skill in the art will understand that the various relationships can be altered to suit the needs of the mask. FIG. 2d shows a circular mask which is preferred. As will be explained later, it is preferable to employ a frame forming mask which will form a series of apertures in the frame. These apertures, which need not have precisely determined dimensions or locations, allow an etchant to reach the intermediate (or lift-off) layer in a later step. Since this step of plating the frame may plate metal on top of metal plated in the previous plating steps, the frame forming mask must be properly aligned with the substrate so the etchant conducting apertures will reach through previously plated layers, to the intermediate layer.

The next step in the process is to remove the thin plating layer by a sputter etch process. To conclude the manufacture of the mask it is lifted off the intermediate layer by selectively etching the intermediate layer. This lift off is facilitated by forming apertures in the frame so etchant can reach the intermediate layer. If the intermediate layer is a resist such as Shipley Company positive working resist, a suitable solvent is acetone. On the other hand, in the case of a metal intermediate layer, suitable etchants can be used determined by the metal used. In the case of a Ti intermediate layer a 5 to 25% Hf solution with water will selectively etch the Ti. Those skilled in the art will understand that the etchant will have to be selected so that it will not attack the metal from which the mask has been made. The lift off process can usually be speeded up by ultrasonic agitation and/or heating. Of course, when only a single layer acts as both an intermediate (or lift off) layer and as a plating base, it can be removed in one step. For instance, Ni, Co, Fe, Zn and Cd can be selectively etched in the presence of Au by $FeCl_3$ and $H_2O_2$; and in the presence of Cu, either by $FeCl_3$, $HNO_3$ and $H_2O_2$ or ammonium persulfate or similar suitable etchant. Thus, we can eliminate the sputter etch step to simplify the process.

Now that the process of manufacturing a mask in accordance with our invention has been described, we will describe a specific example.

EXAMPLE

A suitable substrate, such as round glass (Corning-0211) is cleaned by Kern DeContam solution (1 hour), rinsed with de-ionized water (0.5 hours), soaked in acetone for approximately 5 minutes, rinsed with alcohol, degreased with Freon TF-11 (approximately 15 minutes) and then nitrogen dried. The substrate is maintained in a vacuum desicator until it is loaded in an evaporator. Preferably the substrate is below 30 mils in thickness and, if not glass, some other material which is conformable, such as silicon or quartz.

An intermediate layer (Cr or Ti) is evaporated.

Evaporation is carried out at a rate slow enough to prevent sputtering of metal at the source during evaporation.

An additional evaporation step takes place to provide a gold plating layer, 300–3,000 angstroms in thickness.

Evaporation may take place under the following condition:
Substrate temperature, 20° C to 200° C for Cr or
Ti evaporation and 20°–25° C for Au evaporation

| | |
|---|---|
| Vacuum pressure, 6 Torr | |
| Power source: electron gun | |
| Evaporation rate | |
|    Chromium: | 2–3 A per second |
|    Ti: | 7 A + 100% per second − 50% |
|    Au: | 9 A + 100% per second − 50% |

Shipley resist 1350 J is spun on at 2,000 rpm to 6,000 rpm and preferably at 4,000 rpm. Resist is then prebaked at 80° C for 2 minutes. A thickness of about 1.6 microns is preferable, although a thickness of 1.0 micron up to 2.5 microns are practical. Preferably the resist is applied with a hypodermic needle fitted with a one micron filter. The resist should be allowed to reach room temperature before application.

Subsequent to coating with the resist the first forming mask, that is mask 20, is aligned with the substrate, exposed to proper radiation and the substrate is developed. More particularly, the forming mask 20 includes an outside rim, which will form the first layer of the frame, and this is exposed for eight seconds and developed. The exposure time is for ultraviolet light 3,000 to 4,000 angstrom wave length range at a power level of 18 milliwatts per cm². The active area exposure time is 3 to 4 seconds followed by developing. Specifically in developing, the sample is immersed in a fresh developing solution for 20 seconds, then into a second fresh developing solution for 10 seconds and sprayed with fresh developer for 10 seconds. Post bake is effected at 80° C for 20 minutes. In this first pattern forming step, alignment is not critical so long as the active area is centered well enough to allow the final frame to be completed without interfering therewith.

Subsequent to development, the resist residue is cleaned off by exposure to plasma (such as in an International Plasma Corporation plasma etcher employing 50 watts in a forming gas atmosphere at a vacuum pressure of 1.1 microns for three minutes). Alternatively it is exposed to 1% $O_2$ in Argon plasma to accomplish the same end result.

The resist now forms a mold containing the pattern transferred from the first forming mask 20. Plating is now effected in a Selrex BDT-510 bath at an overall current density of 3 milliamps per square centimeter. A suitable plating rate is approximately 26 angstroms per second. The bath should be maintained at a pH of 8.5 to 9.5 and preferably 9.0 and the gold content of the bath should not be allowed to fall below about 7 grams per liter. If using Cu metallized substrate as a cathode one may wish to go into the gold bath with the current on. In such case the current density should be 3 milliamps per square centimeter with a constant current power supply. Preferably mechanical agitation is employed, with a paddle traveling at about 45 to 50 centimeters per second and the bath is maintained at 20°–25° C. The plating cell showing the arrangement of the cathode, anode and the paddle is described in U.S. Pat. No. 3,652,422. The gold content of the bath should be maintained between 7 and 16.5 grams per liter. With a cathode area of 126 square centimeters the total current is 378 milliamps. Once plating is begun, the current density can be lowered to one milliamp per square centimeter provided the same total number of coulombs are used each time during deposition regardless what current is used.

Subsequent to plating of the first layer, the resist can be removed by soaking in acetone for five minutes, rinsing in ethanol and exposing to plasma, as before, in a forming gas at 50 watt power level for 30 minutes to remove resist residue. Alternatively, removing this resist can be eliminated and instead the first coating of resist should be baked out at 100° C for 20 minutes.

In either event a second coating of resist, Shipley 1350 J is now preferably spun on at 2,000 rpm. Optimally, the thickness of this resist should be in the range of 2.2 – 2.5 microns and it may be prebaked at 80° C for 20 minutes.

The second forming mask, 21 is now exposed. The outside rim may be exposed for 10 seconds and the active area may be exposed for approximately 4.5 – 5.5 seconds. Development occurs as before. The post baking is accomplished at 80° C for 20 minutes. Alignment of this mask is critical to avoid possible even partial blocking of the already opened apertures in the first layer.

The resist is now exposed to plasma, as before, and the second level is plated. The second level may be overplated about 0.5 to 1 micron above the thickness of the resist. In this regard, see FIG. 1d which illustrates overplating.

The remaining resist may now be removed, or, it may be baked again as desired.

A third level of resist is now applied and after waiting for 5 to 10 minutes is spun on at 2,000 rpm and is prebaked at 80° C for 20 minutes.

Assuming that we are plating a third level in the active area, the third forming mask 22 may now be employed and the resist exposed and developed. The rim exposure (for frame) can be 12 seconds and the active area exposure can be 5 to 7 seconds with development as indicated before. Post baking follows at 80° C for 20 minutes. As indicated, depending upon the mask pattern, it may be possible to eliminate the pattern geometries in the active area portion in the mask and to replace them with reinforcing ribs. etc.

Subsequent to plating the substrate is exposed to plasma resist residue removal as before.

The now prepared and developed resist is plated with a third level in the same bath employing the same conditions. This level may be overplated 1 to 2 microns, so long as accurate alignment has been maintained so as to avoid overplating or obscuring the previously formed apertures. The resist is removed as previously described.

To remove the resist residue which may remain after development the sample is exposed to plasma of forming gas or 1% $O_2$ in Argon plasma for 40 to 60 minutes.

A thick fram resist, Shipley 1350 J, for instance, is now applied by spin coating at 2,000 rpm and prebaked at 80° C for 20 minutes.

A frame forming mask is now aligned and the substrate is exposed and developed. Resist thickness can be relatively thick, up to 25 microns. Preferably, the frame forming mask includes a pattern of apertures, whose size is not critical. Furthermore, it is not necessary that the aperture opening be maintained constant. These apertures will allow the etchant solution used to dissolve the intermediate layer, to reach that layer. Of course, the apertures in the frame mask should align with the apertures in the frame area found in masks 20, 21 and 22. To ensure this alignment, alignment marks can be incorporated on the mask and on the first three frame forming masks. The circular frame is preferable as that form reduces the non-uniform stress distribution that is usually associated with corners which may be significant prior to and after liftoff. The exposure time for the frame forming mask can be 8 seconds to 20 seconds depending on the type and the thickness of the resist. Development and post baking occur as specified above. Good development is necessary to produce clean edges before plating to prevent tears developing during deposition. The developed resist can be exposed to either forming gas or 1% $O_2$ in Argon plasma for 5 to 6 minutes. The frame is now plated, using copper or gold. A gold frame can be plated up to 0.5 mils, for instance, by plating for 40 minutes at a rate of 52 angstroms per second with a current density of 3 milliamps per square centimeter. It is possible to have even thicker frames, plated to 5 to 20 mils. Of course, in the latter case it might be preferable to employ copper as the frame material in view of the cost of gold.

Subsequent to plating of the frame the remaining resist can be removed using procedures explained above.

It is now necessary to apply resist in order to protect the frame during the removal of the plating base or seed layer which is 300–3,000 angstroms in thickness. To effect this the substrate is coated with a first resit which can be spun on to a thickness of 1.6 microns and prebaked at 80° C for 20 minutes. This resist is now aligned with a mask similar to 22. After exposure and development the resist is open only at the apertures in the active area, and at the apertures in the frame and portions of the substrate outside of the frame. At this time, the plating or seed layer is etched, either by a sputter etching technique in a plasma or by immersing the sample in a dilute solution of $KI + I_2$. Since the plating or seed layer is small, a short etch (such as 4–6 seconds in either the plasma or in the aqueous solution) is sufficient. The remaining resist is now removed and an additional second layer of etching resist (Shipley 1350 J) is applied and after waiting for 15 minutes is spun on at about 2,000 rpm and is then prebaked at 80° C for 20 minutes. The resist can now be exposed and developed with a mask designed to remove resist only in the area outside of the frame outside the mask area on the edges of the wafer. Relatively long exposure, 15 seconds can be employed to insure that all the resist outside the frame is removed, the resist is developed as before and post baked. The resist covering the active area should be continuous to protect that area during the second etching step. During the plating of first, second and third layers, plating has taken place both in the active area, in the area to be occupied by the frame as well as in the portion of the wafer outside the frame. The second etching step removes material plated in the area outside the frame. To ensure that all this material is removed the substrate can be immersed in an aqueous solution of $KI + I_2$ for 20 minutes and then rinsed with distilled water. Following this etching step, the remaining resist is removed. In an alternate approach it is possible to design masks 20, 21, 22 and frame forming mask in such a way that the step of the second etching of thick gold will not be necessary.

The mask now is substantially complete with the exception of removal of the substrate by liftoff.

As was mentioned above, apertures are provided in the frame to allow the etching solution to reach the intermediate layer during this etching step. If the intermediate layer was chrome the etching takes place in an $AlCl_2 - ZnCn_2$ solution, for approximately 3 to 4 hours wherein the solution is maintained at 90° C. The chrome can also be removed using ceric sulfate or any other suitable chrome etchant. Actually, where chromium is employed as the intermediate layer the mask should be left in the sputter etcher in order to remove initial portions of the chrome layer. This is preferable since the initial removal of chrome can be violent which may cause tears or rends in the pattern.

In the case, however, where titanium is employed as the intermediate layer this procedure is not necessary. Rather, the mask is immersed in a 25% Hf solution at room temperature or even a high temperature such as 70° C for approximately 1 to 6 hours. The solution should be stirred only until the Ti layer under the active area (pattern area) is removed from the substrate after which no stirring should be employed to prevent tearing during the removal of the remaining Ti under the frame.

In the case of this procedure when the substrate used was 0211 glass, a residue may be found on the surface of the mask after liftoff. This residue consists of $CaF_2$ crystals. This residue can be removed in one of two ways:

1. Soaking in sodium hydroxide (50%) solution; or
2. Allowing the mask to remain in distilled water in a slow thorough wash until the crystals are dissolved.

Figure 3A:
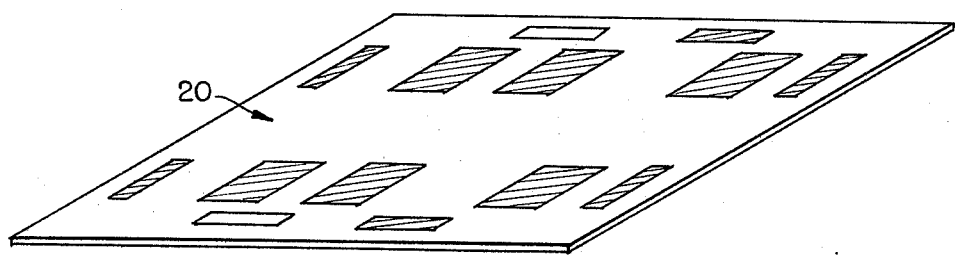
FIGS. 3a, 3d, and 3g illustrate forming masks which may be employed in practicing this invention; and, FIGS. 3b, 3c, 3d, 3f and 3h through 3j are isometric views of a typical mask showing its condition in various stages of manufacture.
Figure 3B:
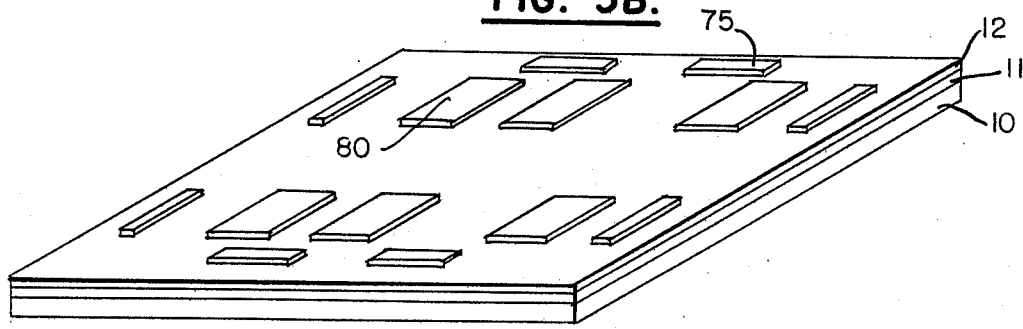

To illustrate the manner in which the preceding steps cooperate to produce the desired mask we will now refer to FIGS. 3a through 3j which illustrate the condition of the mask, as it is being constructed in the various steps and the corresponding configurations of typical forming masks employed. FIG. 3a illustrates a typical form for a first forming mask 20. On this mask the aperture pattern is indicated by hatched areas. Assuming a positive photoresist is employed the hatched areas are light blocking. In addition to the pattern in the active area FIG. 3a also illustrates a number of light blocking areas which are employed to form the "holes" in the frame area so that the intermediate layer etchant solution can reach the intermediate layer.

Figure 3C:
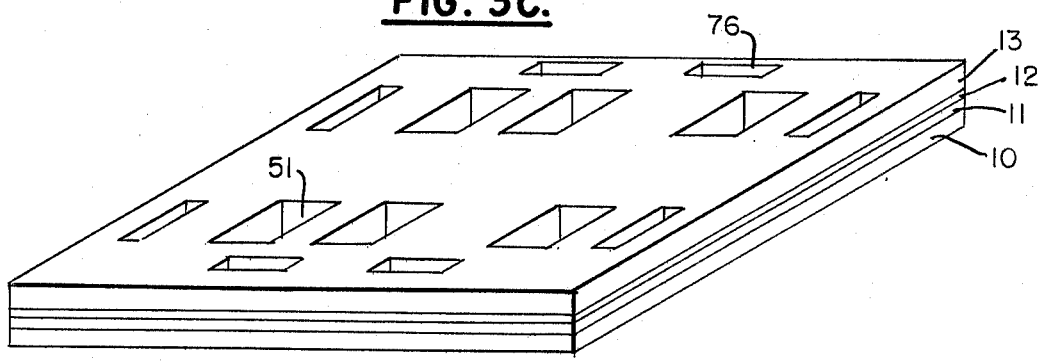

As disclosed above a suitable substrate 10 is provided with the intermediate layer 11 as well as the plating base 12. A suitable resist is then applied and exposed through the forming mask, such as forming mask 20 illustrated in FIG. 3a. After development the mask takes the form illustrated in FIG. 3b. As illustrated there a plurality of areas 80 of resist remain corresponding to the pattern on the forming mask 20. In addition, a further series of areas 75 remain from the resist coating 18 which are employed to generate holes in the frame area. After the first plating step and resist removal the mask takes the form illustrated in FIG. 3c where a plated layer 13 is now deposited above the plating base 12. As is illustrated in FIG. 3c a plurality of apertures 51 are now formed in the layer 13, which is the first mask layer. In addition, a further series of apertures 76 are provided in the frame area for reasons previously explained.

Figure 3D:
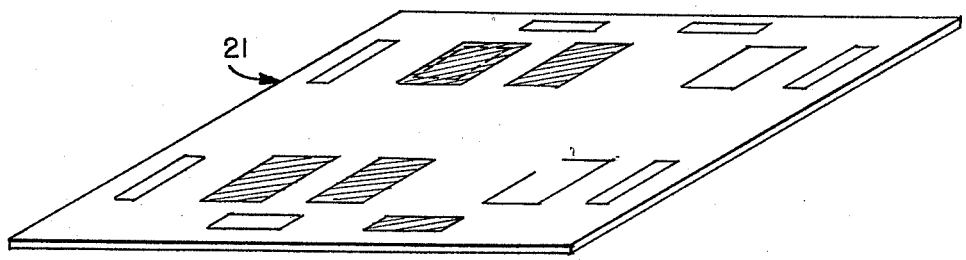
Figure 3E:
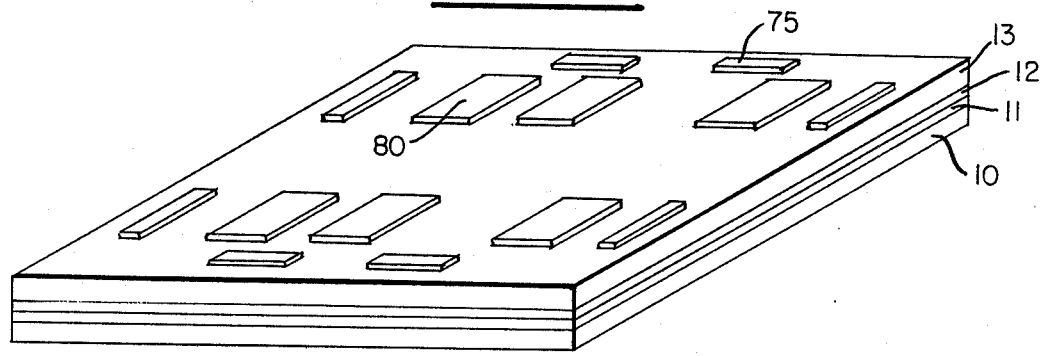

The product illustrated in FIG. 3c has an additional layer of resist applied thereto. This resist is now exposed, employing the second forming mask 21 illustrated in FIG. 3d. It will be seen that the pattern on the forming mask 21 in the active area, is similar to that employed on the mask 20 (FIG. 3a). Again, assuming a positive resist is being employed the shaded areas are light blocking. In order to illustrate the relationship between the pattern on a forming mask 21, as compared to the pattern on forming mask 20, a dotted outline is illustrated in FIG. 3d corresponding to the outline of the corresponding element in the active area of the forming mask 20. It should be understood that in actual practice the forming mask 21 would not include structure such as that of the dotted showing. It is useful, however, to point out that the elements in the active area of the forming mask 21 are geometrically similar to the corresponding elements in the active area of the forming mask 20, although slightly oversized. For instance, each element in the active area of the mask 21 can be up to 10% larger than the corresponding element in the active area of the mask 20. The elements in the frame area of the forming mask 21 may be the same size as the elements in the frame area of the forming mask 20. The mask, illustrated in FIG. 3c, has an additional layer of resist applied thereto which is then exposed employing the second forming mask 21. When developed, the mask will now take the form illustrated in FIG. 3e wherein a volume of resist 80 remains for each element in the active area of the mask 21. Similarly, a volume of the resist layer remains (illustrated at 75, for instance) corresponding to each element in the frame area of the forming mask 21.

Figure 3F:
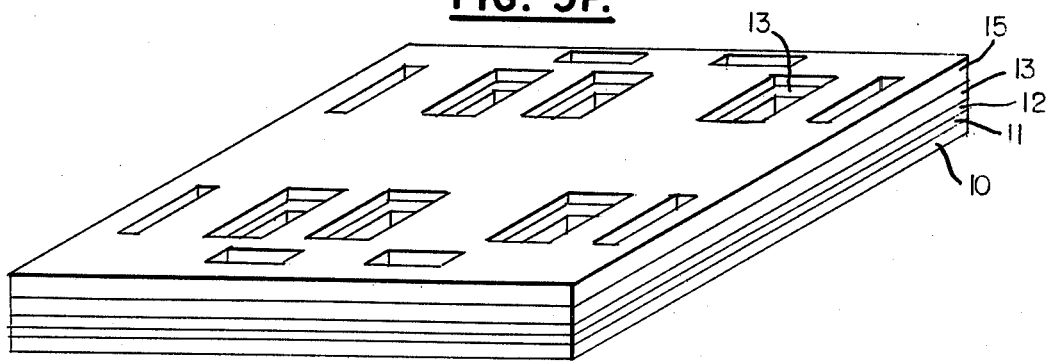

After the second plating step the mask takes the form illustrated in FIG. 3f. The plated layer 15 includes apertures for each of the different volumes of resist which remained after developing. Thus, for each of the elements in the active area of the forming mask 21 an aperture exists in the plated layer 15. As illustrated in FIG. 3f the aperture in the plated layer 15 is slightly larger than the corresponding aperture in the plated layer 13.

At this point, the mask, depending on its geometric dimensions, density of apertures and a total plated film thickness may in fact provide sufficient strength so that further mask layers are not necessary. On the other hand, additional masking layers may be required. Accordingly, additional layers of resist can be employed which are exposed through additional forming masks. If desired, a third forming mask can be employed with a pattern, in the active area, which is similar to the pattern of the forming mask 21. In accordance with the teachings of this invention, however, each such element in the active area would be slightly oversized as compared to the corresponding element in the active area of the forming mask 21. When the resist layer is developed, and plating occurs, an additional playing layer will be produced which bears the same relation to plating layer 15, as plating layer 15 bears to the first plating layer 13. Of course, the steps of resist coating, exposure through properly configured forming masks, developing and plating can be carried out as many times as desired.

Figure 3G:
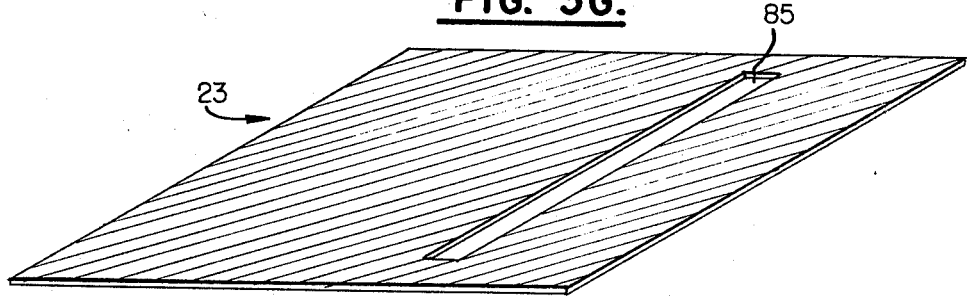
Figure 3H:
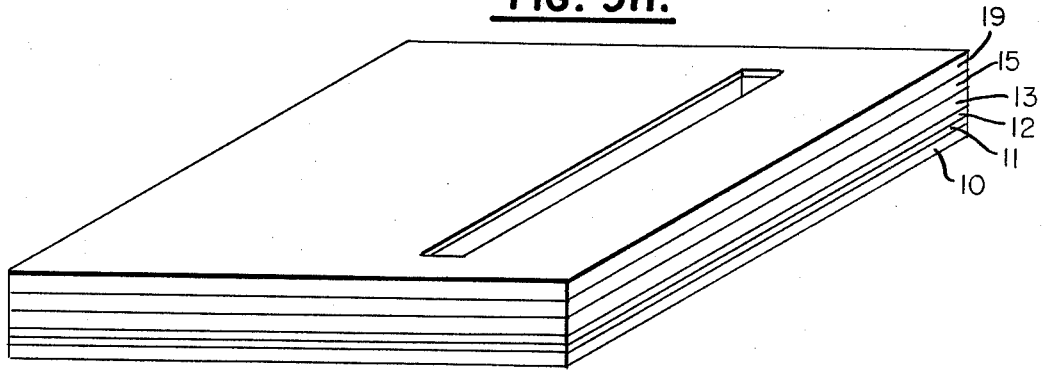
Figure 3I:
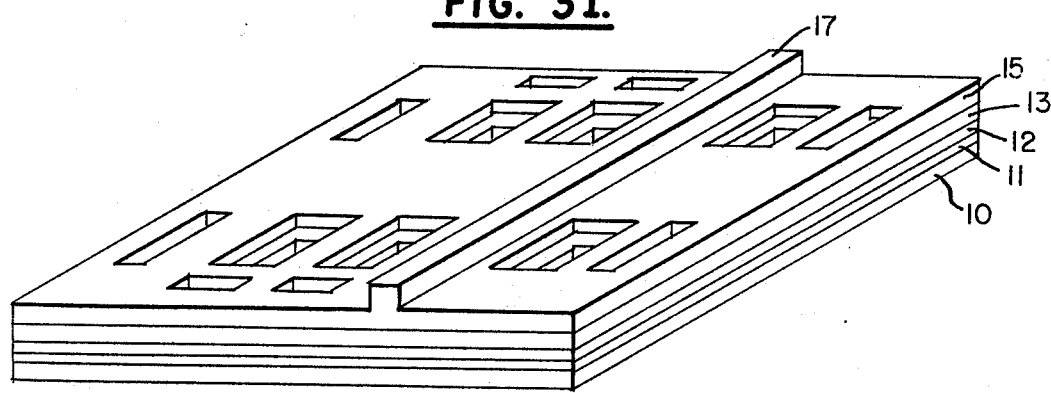

The final exposure step is forming the active area which may, in fact, be the third exposure step, can be carried out using a forming mask which is not similar to the previously employed forming masks in the active area. Such forming masks can be arranged to provide a series or patterns of reinforcing ribs or large plated regions (areas) in areas where the apertures are not closely spaced. A forming mask suitable for forming a single rib is illustrated in FIG. 3g as forming mask 23. In particular, forming mask 23 employs a single stripe 85 which is light transmissive, assuming a positive resist is employed. Thus, for the final exposure step an additional layer of resist 19 is applied to the product illustrated in FIG. 3f. When this layer of resist is exposed employing the forming mask 23, and developed, the resulting product is that shown in FIG. 3h. After plating, and removal of remaining resist, the resulting product is illustrated in FIG. 3i which is similar to FIG. 3f except that a reinforcing rib 17 now lies atop the previously upper plating layer 15. Although not shown in the figure these ribs or plated regions are interconnected in a lacework all the way to the areas where the frame is to be deposited in the subsequent step. After plating of the frames the thick ribs connect to the frame to provide both rigidity and heat conductive paths.

Figure 3J:
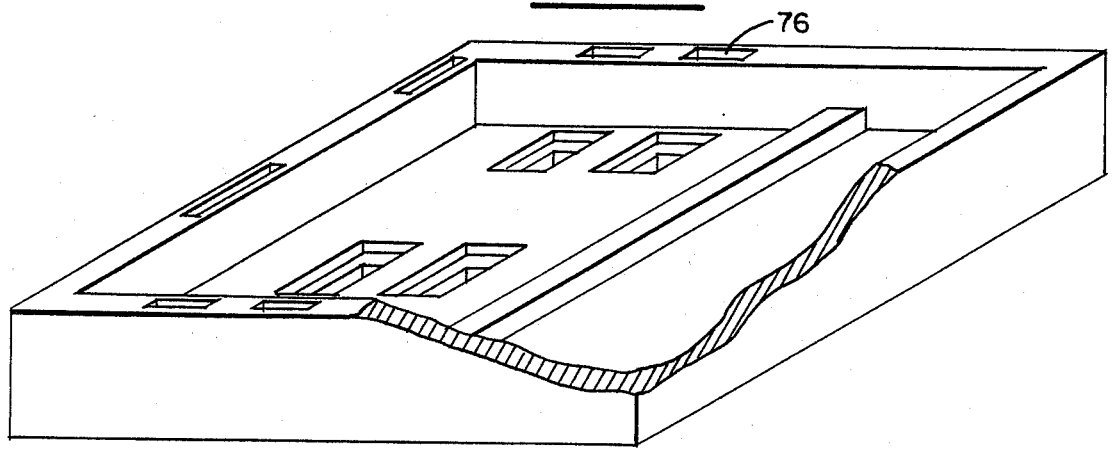

FIG. 3j illustrates the final product after a relatively thick frame has been plated in the frame area. Prior to achieving the form illustrated in FIG. 3j the plating base 12 is sputter etched and the mask lifted off the substrate 10 by selective etching of the intermediate (or liftoff) layer 11. As illustrated in FIG. 3j the frame includes a series of apertures 76 to allow the etchant to reach the intermediate layer 11.

Although use of a positive working Shipley resist has been mentioned, those skilled in the art will understand, from the foregoing description, that a negative working KTFR or similar resist can also be employed. Of course, the polarity of the forming masks, e.g., 20–23, may have to be suitably selected. Removal of such negative resist can be accomplished with a suitable chemical resist stripper or using oxygen plasma.

As we previously mentioned where a high resolution pattern is required the first metal layer can be formed with a resist such as polymethylmethacrylate (PMMA) or other suitable E-beam or X-ray sensitive resist with appropriate radiation.

Although the example mentions a gold plating for the various mask layers, copper or a copper alloy can also be used, as is indicated above. When plating copper, to prevent edge buildup, one has to resort either to galvanostatic or potentiostatic pulse plating or to suitable leveling agents. In any event, the overall current density has to be controlled quite carefully to prevent edge buildup. When fabricating the mask from copper it is preferred to use an aqueous Hf solution as an etchant for liftoff. This solution substantially does not chemically dissolve copper. This limitation on the choice of chemical liftoff solution requires that the intermediate (liftoff) layer be made of: Ti, Ta, Hf, Nb or any such similar Hf soluble element or alloy. Alternatively, the lift off layer can be a readily selectively soluble polymer. When using copper to electroform the mask, preferably the plating base layer 12 is copper, or any other readily platable metal which, in the presence of Hf, is more electrochemically active (less noble) than copper.

The exposure scheme briefly mentioned at page 5, lines 12–22 is disclosed in more detail in the co-pending Stuckert application, Ser. No. 474,627 (Y0973—056) filed May 30, 1974.

I claim:
1. A method of forming a thick self-supporting mask with aspect ratio greater than 1 suitable for electron beam projection processing comprising the steps of:
(a) depositing, on a conformable substrate selected from glass, quartz, silicon and sapphire, a layer of material comprising a readily soluble polymer or a metal selected from Ti, Al, Cr, Zn, Hf, Nb, Ta and alloys or mixtures thereof which is selectively soluble in the presence of Au or Cu;
(b) depositing on the product of step (a) a plating base of a readily platable more noble metal of thickness in the range of 300–3,000 angstroms;
(c) coating the product of step (b) with a suitable radiation sensitive material to a predetermined thickness;
(d) transferring a pattern to said material by exposing it to a pattern of radiation and developing said exposed material;
(e) plating a metal selected from Au and Cu into said pattern to a thickness no greater than said predetermined thickness;
(f) coating the product of step (e) with a second radiation sensitive material to a second predetermined thickness;
(g) transferring a second pattern to said second material by exposing it to a second pattern of radiation and developing said exposed material wherein said second pattern is geometrically similar to said first pattern; and,
(h) plating additional metal into said second pattern in said second material, said additional metal selected from Au or Cu.

2. The method of claim 1 wherein said predetermined thickness is smaller than said second predetermined thickness.

3. The method of claim 1 wherein said predetermined thickness is up to 2.5 microns.

4. The method of claim 1 wherein said step (d) employs and E-beam controlled to generate said pattern of radiation.

5. The method of claim 1 wherein at least one of said transferring steps employs suitable forming mask to modulate said radiation to provide said pattern of radiation.

6. The method of claim 5 wherein said radiation of said at least one transferring step is X-rays.

7. The method of claim 5 wherein said radiation of said at least one transferring steps is U.V. light with wavelength in the range 3,000–4,000 angstroms.

8. The method of claim 1 which includes the additional step of providing, by plating, a suitable frame for support purposes.

9. The method of claim 1 which includes the additional steps of:
(i) coating the product of step (h) with a third radiation sensitive material,
(j) transferring a third pattern to said third material by exposing it to a third pattern of radiation and developing said exposed material to provide, in said third material said third pattern, and
(k) plating further metal into said third pattern in said third material, said further metal selected from Au or Cu.

10. The method of claim 9 in which said third pattern is geometrically similar to said second pattern.

11. The method of claim 9 in which said third pattern results in a third plated layer having a plurality of reinforcing ribs or areas.

12. The method of claim 1 which includes the further steps of lifting said mask off said substrate by:
(i) dissolving said intermediate layer in a suitable solvent if a soluble polymer, or
(ii) etching said intermediate layer with an etchant which will selectively attack said intermediate layer in the presence of Au or Cu, if said intermediate layer is a metal.

13. The method of claim 1 wherein step (i) employs acetone as said suitable solvent.

14. The method of claim 1 wherein step (ii) said etchant is a 5-25% HF solution in water for a Ti material deposited in step (b).

15. A method of forming a thick self-supporting mask with aspect ratio greater than 1 suitable for electron beam projection processing comprising the steps of:
(a) depositing on a conformable substrate of glass, quartz, silicon or sapphire a layer of material selected from Ni, Cu, Fe, Zn, Co, Cd, Sn or alloy and mixtures thereof:
(b) coating the product of step (a) with a suitable radiation sensitive material to a predetermined thickness;
(c) transferring a pattern to said material by exposing it to a pattern of radiation and developing said exposed material;
(d) plating a metal selected from Au and Cu into said pattern to a thickness no greater than said predetermined thickness;
(e) coating the product of step (d) with a second radiation sensitive material to a second predetermined thickness;
(f) transferring a second pattern to said second material by exposing it to a second pattern of radiation and developing said exposed material wherein said second pattern is geometrically similar to said first pattern; and,
(g) plating additional metal into said second pattern in said second material, said additional metal selected from Au or Cu.

16. The method of claim 15 wherein said predetermined thickness is smaller than said second predetermined thickness.

17. The method of claim 15 wherein said predetermined thickness is up to 2.5 microns.

18. The method of claim 15 wherein said step (c) employs an E-beam controlled to generate said pattern of radiation.

19. The method of claim 15 wherein at least one of said transferring steps employ a suitable forming mask to modulate said radiation to provide said pattern of radiation.

20. The method of claim 19 wherein said radiation of said at least one transferring step is X-rays.

21. The method of claim 19 wherein said radiation of said at least one transferring step is U.V. light with wavelength in the range of 3,000–4,000 angstroms.

22. The method of claim 15 which includes the additional steps of providing, by plating, a suitable frame for support purposes.

23. The method of claim 15 which includes the additional steps of:
(i) coating the product of step (h) with a third radiation sensitive material,
(j) transferring a third pattern to said third material by exposing it to a third pattern of radiation and developing said exposed material to provide, in said third material said third pattern, and
(k) plating further metal into said third pattern in said third material, said further metal selected from Au or Cu.

24. The method of claim 23 in which said third pattern is geometrically similar to said second pattern.

25. The method of claim 23 in which said third pattern results in a third plated layer having a plurality of reinforcing ribs or areas.

26. The method of claim 15 which includes the further steps of lifting said mask off said substrate by:
etching said intermediate layer with an etchant which will selectively attack said intermediate layer in the presence of Au or Cu, if said intermediate layer is a metal.

27. The method of claim 26 in which said etchant is selected from $FeCl_3$, $HNO_3 + H_2O_2$ and ammonium persulfate.

28. The product produced by the method of claim 1.

29. The product produced by the process of claim 15.

* * * * *

UNITED STATES PATENT AND TRADEMARK OFFICE
CERTIFICATE OF CORRECTION

PATENT NO. : 4,080,267
DATED : March 21, 1978
INVENTOR(S) : Catellani et al

It is certified that error appears in the above-identified patent and that said Letters Patent are hereby corrected as shown below:

In column 4, line 10, change "not" to --now--.

In column 7, line 11, correct the spelling of "thickness".

In column 11, the formula should read

-- Chromium: 2-3 $°A$ per second

Ti: $7 °A \pm {}^{100\%}_{50\%}$ per second

Au: $9 °A \pm {}^{100\%}_{50\%}$ per second --

Also in column 11, last line, the patent number should read --3,652,442--.

In column 15, line 61, change "is" to --in--.

Signed and Sealed this

Twenty-second Day of August 1978

[SEAL]

Attest:

RUTH C. MASON
Attesting Officer

DONALD W. BANNER
Commissioner of Patents and Trademarks